United States Patent
Ding et al.

(10) Patent No.: US 7,861,198 B2
(45) Date of Patent: Dec. 28, 2010

(54) DISTORTED WAVEFORM PROPAGATION AND CROSSTALK DELAY ANALYSIS USING MULTIPLE CELL MODELS

(75) Inventors: Li Ding, Sunnyvale, CA (US); Peivand Tehrani, Camarillo, CA (US); Jindrich Zejda, Sunnyvale, CA (US); Alireza Kasnavi, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 588 days.

(21) Appl. No.: 11/863,252

(22) Filed: Sep. 28, 2007

(65) Prior Publication Data

US 2009/0089729 A1    Apr. 2, 2009

(51) Int. Cl.
   *G06F 17/50* (2006.01)
(52) U.S. Cl. .......................................... 716/6
(58) Field of Classification Search ........................ None
    See application file for complete search history.

(56) References Cited

U.S. PATENT DOCUMENTS

| | | | | |
|---|---|---|---|---|
| 6,023,568 A * | 2/2000 | Segal | ............................. | 716/6 |
| 6,601,220 B1 * | 7/2003 | Allen et al. | ..................... | 716/4 |
| 6,807,520 B1 * | 10/2004 | Zhou et al. | ..................... | 703/14 |
| 7,272,807 B2 * | 9/2007 | Ding et al. | ..................... | 716/6 |
| 7,337,416 B1 * | 2/2008 | Srinivasan et al. | ............. | 716/4 |
| 7,359,843 B1 * | 4/2008 | Keller et al. | ................... | 703/2 |
| 7,444,605 B2 * | 10/2008 | Wang et al. | ..................... | 716/5 |
| 2007/0010981 A1 * | 1/2007 | Ding et al. | ..................... | 703/14 |

OTHER PUBLICATIONS

Qian et al., "Modeling the 'Effective Capacitance' for the RC Interconnect of CMOS Gates," IEEE Trans. on CAN of ICs and Systems, vol. 13, No. 12, Dec. 1994, pp. 1526-1535.*
Zejda et al., "TBNM—Transistor-Level Boundary Model for Fast Gate-Level Noise Analysis of Macro Blocks," Proc. of the 7th Int'l Symposium on Quality Electronic Design (ISQED'06), 2006 IEEE, 6 pages.*

* cited by examiner

*Primary Examiner*—Leigh Marie Garbowski
(74) *Attorney, Agent, or Firm*—Silicon Valley Patent Group,LLP; Edward S. Mao

(57) ABSTRACT

A method to perform timing analysis for a complex logic cell with distorted input waveform and coupled load networks is presented. Timing arc based models are used in conjunction with CCB based current models of portions of the logic cell to compute the output signal of the logic cell. For example, an intermediary signal is generated using a first timing arc based model and an equivalent coupled network output signal is generated using a channel connected block (CCB) based current model.

24 Claims, 8 Drawing Sheets

DISTORTED WAVEFORM PROPAGATION AND CROSSTALK DELAY ANALYSIS USING MULTIPLE CELL MODELS

BACKGROUND

1. Field of the Invention

The invention relates to the design and testing of integrated circuits. More specifically, the invention relates to a method and an apparatus performing timing analysis of integrated circuits.

2. Related Art

As the complexity, density, and operating frequencies of integrated circuits has increased, signal timing and signal integrity within integrated circuits have become more difficult to maintain. Thus, signal timing analysis should be performed during the design stage of an integrated circuit to increase the likelihood of an acceptable performance of a manufactured integrated circuit. In general EDA (electronic design automation) tool manufacturers use timing libraries for standard cells used in the design of integrated circuits. These timing libraries include timing arc based models for various predefined input signals (waveforms) and various output load capacitance values. While the timing arc based models provide accurate timing for the isolated logic cells, they have difficulties with logic cells embedded within integrated circuit because the shapes of the input signals do not exactly match the waveform shape used during timing model characterization and the load circuit on output of the logic cell is often not a lumped capacitor used during timing characterization but a "coupled networks", i.e. networks of signal nets subject to cross talk and noise from nearby signal nets.

For example, as illustrated in FIG. 1(a), a logic cell 110, which receives an original input signal O_IN_S, provides a final output signal F_OUT_S on a signal net 121, which runs through coupled network 120. Coupled network 120 also includes signal nets 123 and 125. While signal nets 121, 123, and 125 are not physically connected through conducting paths, parasitic capacitances cause a capacitive coupling between signal nets 123 and 121 as represented by parasitic capacitor 124 (note parasitic capacitors are drawn using dashed lines rather than solid lines and have grey background shading). Similarly, signal nets 125 and 121 have parasitic coupling represented by parasitic capacitor 126. In FIG. 1(a), multiple parasitic capacitances are illustrated using a single lumped capacitor. However, in actual coupled networks, the parasitic capacitances are distributed and behave as multiple distributed capacitors. The parasitic coupling of the signal nets in coupled network 120 may cause cross talk and other noise issues for final output signal F_OUT_S of logic cell 110.

Because each chip design results in different forms of coupled networks for each logic cell (e.g. logic cell 110), the timing arc based models can not adequately cover the use of logic cells in coupled networks. Accordingly, the use of timing arc based models is generally limited for uncoupled timing analysis and for very simplified timing analysis using lumped effective capacitance or other approximation for the coupled networks. For example, FIG. 1(b) illustrates a typical circuit that is suited for timing arc based models. Specifically, a logic cell 140, which receives original input signal O_IN_S, drives a final output signal F_OUT_S on signal net 151 in simplified network 150. Original input signal O_IN_S must match a predefined input signal provided with the timing arc based model of logic cell 140. Simplified network 150 may approximate parasitic capacitance using simple lumped effective capacitance or other approximations for parasitic capacitances from other signal nets on signal net 151. In this situation the timing arc based model provides an accurate characterization of final output signal F_OUT_S. However, the timing arc based models do not provide accurate results in a coupled network.

In addition to difficulties with coupled networks, timing arc based models are difficult to use with input signals having "distorted waveforms", i.e. signals that are not very similar to one of the predefined input signals used during timing model characterization. For example, in an integrated circuit, the output signal of a first logic cell is often fed to the input signal of a second logic cell. Even if the effects of coupled networks are not present, the output signal of the first logic cell is unlikely to exactly match one of the predefined input signals for the timing arc based models.

FIG. 1(c) illustrates another method for timing analysis. However the method illustrated in FIG. 1(c) is only suited for small logic circuits for the reasons described below. Specifically, a small logic cell 160, which receives an original input signal O_IN_S, provides a final output signal F_OUT_S on a signal net 171, which runs through coupled network 170. Coupled network 170 also includes signal nets 173 and 175. While signal nets 171, 173, and 175 are not physically connected through conducting paths, parasitic capacitances cause a capacitive coupling between signal nets 173 and 171 as represented by parasitic capacitor 174. Similarly, signal nets 175 and 171 have parasitic coupling represented by parasitic capacitor 176. Small logic cell 160 is divided into one or more channel connected blocks which are illustrated using channel connected blocks (CCB) 161 through 169. As used herein, the term channel connected block (which is well known in the art) refers to a group of transistors whose channels are connected with each other. Channel connected blocks could also have parasitic elements such as capacitors and resistors along with the afore-mentioned transistors. Due to space constraints additional channel connected blocks that may exist between CCB 161 and 169 are not shown. Channel connected block (CCB) based current models are used for each channel connected block of small logic cell 160. Channel connected block (CCB) based current models can be used for coupled network timing analysis. CCB based current models are often based on a dc current table where CCB current is a function of input and output voltage values of that CCB. In addition, CCB based current models can often be used in a time stepper to interact with an arbitrary input waveform shape and an arbitrary RLC coupled load network to produce a piecewise linear output waveform. However, due to the complexity of the CCB-based current models, in practice only very simple circuits (i.e. consisting of only a few CCBs) like inverters, buffers, NAND gates, NOR gates, and certain AOI and OAI gates, etc. can be fully modeled using CCB based current models. Channel connected block based current models are described in U.S. Patent Application 20070010981, entitled "Modeling Circuit Cells for Waveform Propagation" by Ding et al.

For more complex logic cells, often only the boundary layers of transistor level logics are modeled using CCB based current models using techniques such as the one, described in "TBNM—Transistor-Level Boundary Model for Fast Gate-Level Noise Analysis of Macro Blocks" by Jindrich Zejda and Li Ding Proceedings of the 7$^{th}$ International Symposium on Quality Electronic Design (ISQED '06) 2006.

Due to the lack of pre-characterized information on the internal transistor level structure of the complex logic cells, existing CCB based timing analysis method does not apply to complex logic cells. Hence there is a need for a method and apparatus for timing analysis on complex circuits in coupled networks.

SUMMARY

Accordingly, the present invention provides a method to perform timing analysis for a complex logic cell with distorted input waveform and optionally with coupled load networks. For example, in some embodiments of the present invention, timing arc based models are used in conjunction with CCB based current models of portions of the logic cell to compute the output signal of the logic cell. Specifically in one embodiment of the present invention, timing analysis is performed for a logic cell having an original input signal and a final output signal in a coupled network. An intermediary signal is generated using a first timing arc based model and an equivalent coupled network output signal is generated using a first channel connected block (CCB) based current model. The logic cell is divided into an initial circuit, a middle circuit and a final circuit. The original input signal is used to generate an initial circuit output signal using a second CCB based current model. Then an equivalent initial circuit input signal is generated that would produce the initial circuit output signal as an output signal of the initial circuit. The intermediary signal is generated using the first timing arc based model (which models the logic cell) and the equivalent initial input signal. A final circuit input signal is generated that would produce the intermediary signal as an output signal of the final circuit. The final circuit input signal is used in the generation of the equivalent coupled network output signal.

The present invention will be more fully understood in view of the following description and drawings.

DETAILED DESCRIPTION

Figure 2:
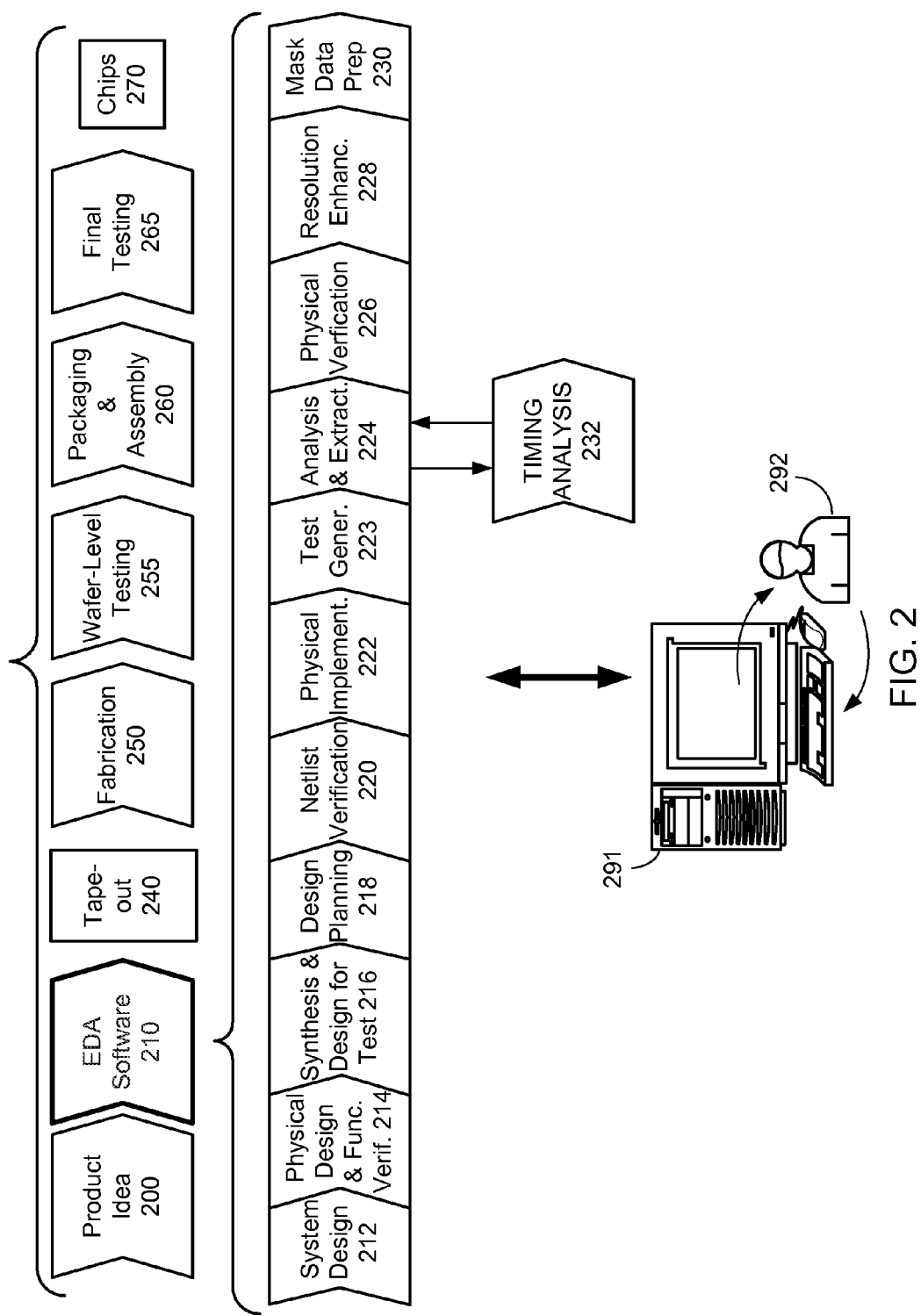
FIG. 2 is a simplified representation of an exemplary digital IC design flow in accordance with one embodiment of the present invention.

It may be helpful to place the processes of this invention in context of the overall chip design. FIG. 2 shows a simplified representation of an exemplary digital IC design flow. At a high level, the process starts with the product idea (200) and is realized in an EDA software design process (210). When the design is finalized, it can be taped-out (event 240). After tape out, the fabrication process (250) creates wafers containing the IC. Wafer level testing (255) can be performed to detect and remove defective wafers (or dies). Then the non-defective dies are packaged and assembled in a packaging and assembly processes (260). Final testing (265) of the packaged IC is a final quality control process to remove any defective products. Packaged ICs that pass the final test result in the finished chips (270) that are delivered to consumers of the IC.

The EDA software design process (210) is actually composed of a number of stages 212-230, shown in linear fashion for simplicity. EDA software 210 and its stages are typically stored in a computer readable medium (e.g. hard disks, DVDs), for use on a computer 291 by a user 292. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC. A brief description of the components of the EDA software design process (stage 210) will now be provided.

System design (stage 212): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 214): At this stage, the VHDL or Verilog code for modules in the system is written and the design (which may be of mixed clock domains) is checked for functional accuracy. More specifically, the design is checked to ensure the design produces the correct outputs. Exemplary EDA software products from Synopsys, Inc. that can be used at this stage include VCS, VERA, DesignWare®, Magellan, Formality, ESP and LEDA products.

Synthesis and design for test (stage 216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 218): Here, an overall floorplan for the chip is constructed and analyzed for timing and top-level routing. Exemplary EDA software products from Synopsys, Inc. that can be used at this stage include Jupiter and Floorplan Compiler products. Although circuitry and portions thereof (such as standard cells) are described herein as if they exist in the real world, it is to be understood that at this stage only a computer model exists in a programmed computer. The actual circuitry in the real world is created after this stage.

Netlist verification (stage 220): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 222): The placement (positioning of circuit elements) and routing (connection of the same) occurs at this step. Exemplary EDA software products from Synopsys, Inc. that can be used at this stage include the Astro and IC Compiler product.

Test Generation (stage 223): Automatic Test Pattern Generation is performed on the design and the test patterns are formatted for automatic test equipment. Exemplary EDA software products from Synopsys Inc. that can be used at this stage include the TetraMAX product.

Analysis and extraction (stage 224): At this step, the circuit function is verified at a transistor level, this in turn permits what-if refinement. Moreover, the analysis tools in this stage 224 produce data indicative of the effect of circuit elements on various design-specific attributes, such as timing, signal integrity, power, and electro migration. Thus timing analysis 232 forms a subset of the functions performed in Analysis and extraction (stage 224). Exemplary EDA software products from Synopsys, Inc. that can be used at this include Star RC/XT, Raphael, Aurora, and PrimeTime products.

Physical verification (stage 226): At this stage various checking functions are performed to ensure correctness for: manufacturing, electrical issues, lithographic issues, and circuitry. Exemplary EDA software products from Synopsys, Inc. that can be used at this stage include the Hercules product.

Resolution enhancement (stage 228): This stage involves geometric manipulations of the layout to improve manufacturability of the design. Exemplary EDA software products from Synopsys, Inc. that can be used at this include iN-Phase, Proteus, and AFGen products.

Mask data preparation (stage 230): This stage provides the "tape-out" data for production of masks for lithographic use to produce finished chips. Exemplary EDA software products from Synopsys, Inc. that can be used at this stage include the CATS(R) family of products.

Figure 1A:
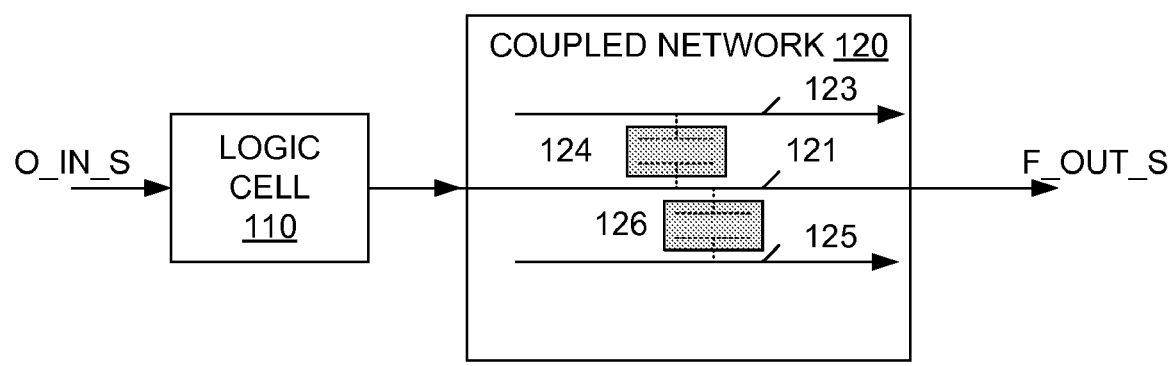
FIG. 1(a) is a simplified block diagram of a circuit with a coupled network.
Figure 1B:
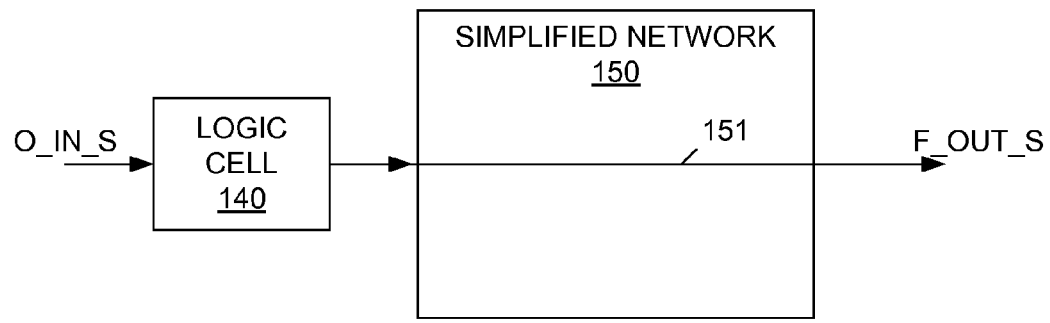
FIG. 1(b) is a block diagram used to illustrated timing arc modeling.
Figure 1C:
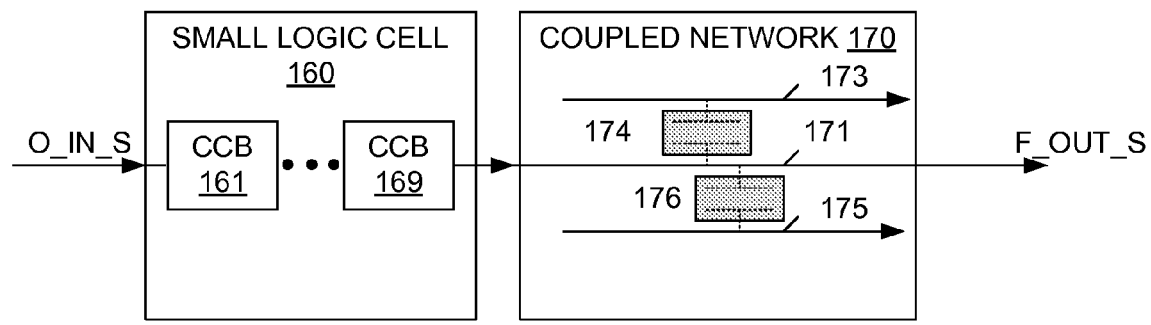
FIG. 1(c) is a block diagram used to illustrated channel connected block based current modeling.
Figure 3:
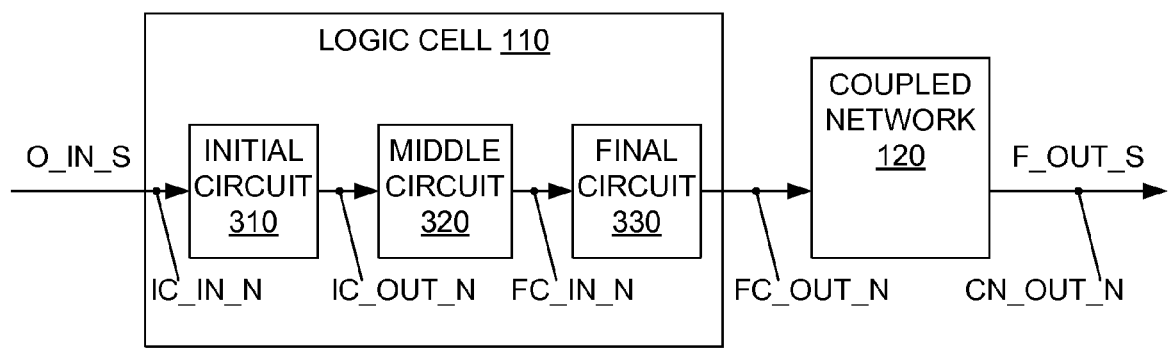
FIG. 3 is a block diagram of a circuit used to illustrate the present invention.

FIG. 3 provides a more detailed block diagram of logic cell 110 and coupled network 120 that is used to describe the present invention. As illustrated in FIG. 3, an original input signal O_IN_S is to be applied to the input terminal of logic cell 110. The output signal of logic cell 110 is to be computed on a signal net that is part of coupled network 120 (See. FIG. 1). Timing analysis is used to find the characteristics of final output signal F_OUT_S, which includes the effects of coupled network 120 (e.g. cross talk) using various intermediary signals. In accordance with one embodiment of the present invention, the circuits of logic cell 110 are classified as initial circuit 310, middle circuit 320, and final circuit 330. Initial circuit 310 receives the input signal for logic cell 110 and to provide a first intermediary signal to middle circuit 320. Middle circuit 320 provides a second intermediary signal to final circuit 330, which provides the output signal for logic cell 110. Although not shown, logic cell 110 may include multiple input terminals receiving multiple input signals and multiple output terminals providing multiple output signals. However, timing analysis in general is performed analyzing one input signal and one output signal at a time. Thus for clarity a single input signal terminal and single output terminal for logic cell 110 is described herein.

Initial circuit 310, which will be subject to Channel Connected block (CCB) based current modeling in accordance with the present invention, includes one or more channel connected blocks. Similarly, final circuit 330, which will also be subject to CCB based current modeling in accordance with the present invention, includes one or more channel connected blocks. Middle Circuit 320 may include one or more channel connected blocks. In general, initial circuit 310 and final circuit 330 contain relatively few channel connected blocks to decrease the resources needed to perform CCB based current modeling of initial circuit 310 and final circuit 330. For convenience and clarity five nodes are labeled in FIG. 3. Specifically, FIG. 3 shows an initial circuit input node IC_IN_N at the input terminal of initial circuit 310 (which is equivalent to the input terminal of logic cell 110), an initial circuit output node IC_OUT_N at the output terminal of initial circuit 310 (which is also the input terminal of middle circuit 320), a final circuit input node FC_IN_N at the input terminal of final circuit 330 (which is also at the output terminal of middle circuit 320), and a final circuit output node FC_OUT_N at the output terminal of final circuit 330 (which is equivalent to the output terminal of logic cell 110). As explained below, a distinction is made between final circuit output node FC_OUT_N prior to coupled network 120 and the same signal net after coupled network 120 in the timing analysis. Thus, FIG. 3 also includes a coupled network output node CN_OUT_N.

Figure 4:
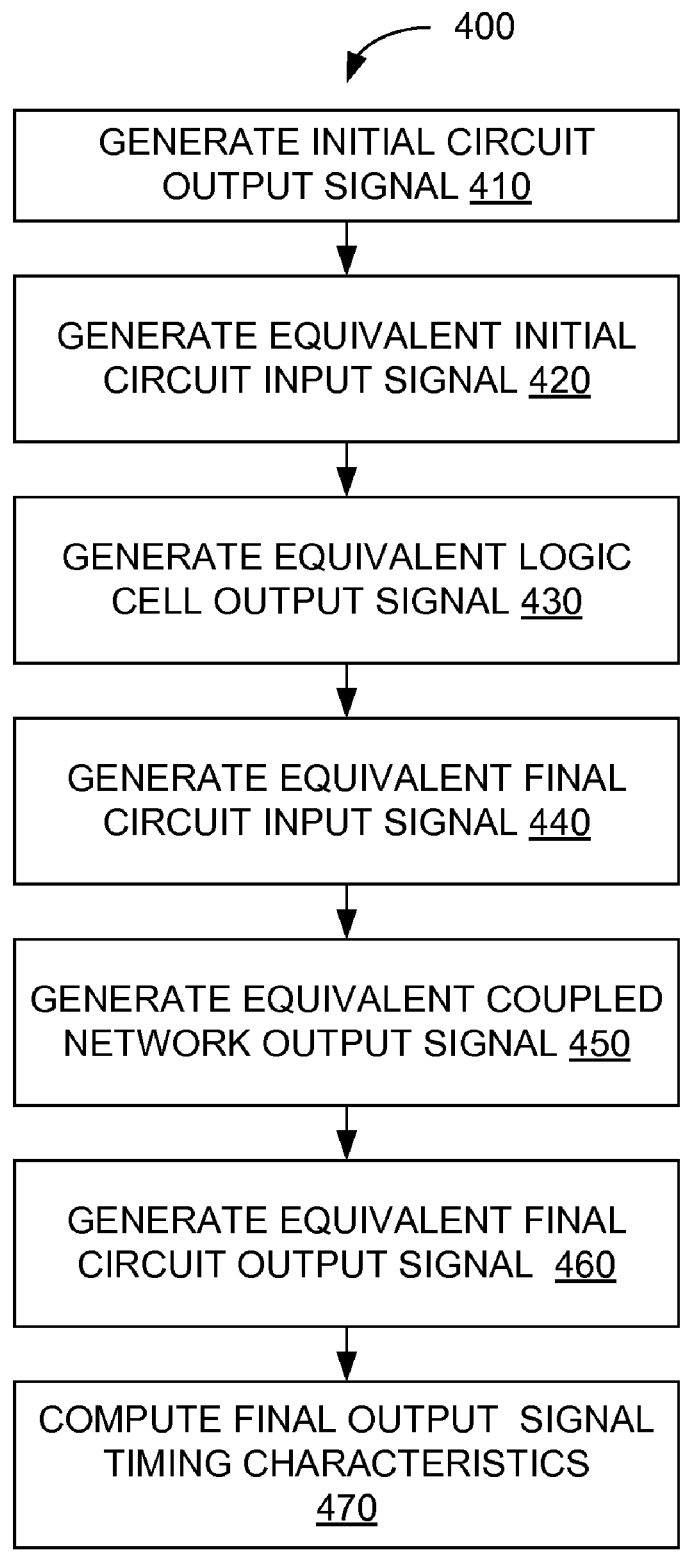
FIG. 4 is a flow chart of one embodiment of the present invention.
Figure 5A:
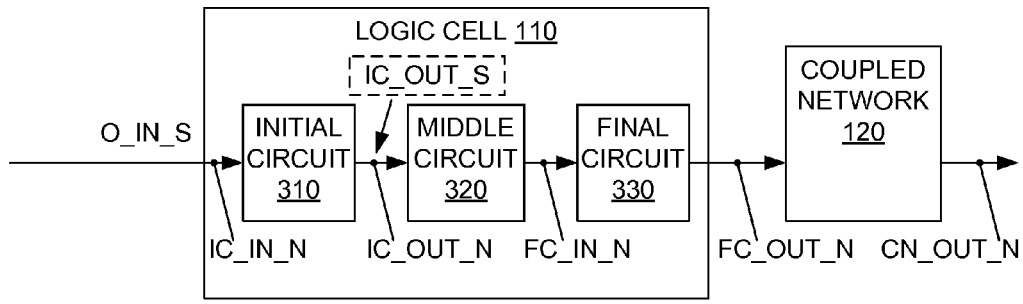
FIGS. 5(a)-5(f) are block diagrams of a circuit with signals labeled to illustrate the present invention.

FIG. 4 is a flow chart 400 illustrating an embodiment of the present invention for performing timing analysis. The method illustrated in FIG. 4 is explained below with reference to FIGS. 5(a)-5(f), which show signals in logic cell 110 and coupled network 120. Specifically, for each stage of flow chart 400, one of FIGS. 5(a)-5(f) shows a source signal and a product signal. The source signal is used by various techniques to generate the product signal. In GENERATE INITIAL CIRCUIT OUTPUT SIGNAL 410, CCB based current models are used to generate initial circuit output signal IC_OUT_S at initial circuit output node IC_OUT_N from original input signal O_IN_S applied at initial circuit input node IC_IN_N. GENERATE INITIAL CIRCUIT OUTPUT SIGNAL 410 is illustrated in FIG. 5(a) with original input signal O_IN_S as the source signal at initial circuit input node IC_IN_N and initial circuit output signal IC_OUT_S as the product signal at initial circuit output node IC_OUT_N. For clarity, the product signals in FIGS. 5(a)-5(f) are illustrated with a dotted line box around the reference. As explained above, initial circuit 310 is fully modeled using CCB based current models and thus various conventional computing methods can be used to generate initial circuit output signal IC_OUT_S. For example, one embodiment of the present invention uses the technique described in U.S. Patent Application 20070010981, entitled "Modeling Circuit Cells for Waveform Propagation" by Ding et al.

Figure 5B:
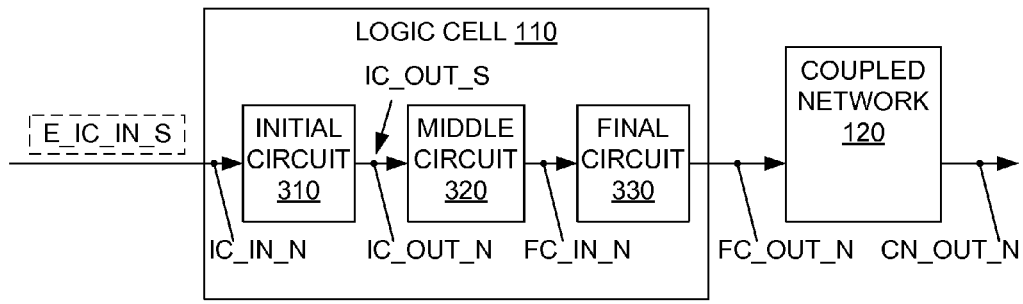

Initial circuit output signal IC_OUT_S, is then used as the source signal (FIG. 5(b)) to generate equivalent initial circuit input signal E_IC_IN_S (i.e. the product signal) in GENERATE EQUIVALENT INITIAL CIRCUIT INPUT SIGNAL 420. Specifically, equivalent initial circuit input signal E_IC_IN_S is a signal that can be used with the timing arc based models (i.e. is not a distorted waveform). Furthermore, equivalent initial circuit input signal E_IC_IN_S is generated so that when equivalent initial circuit input signal E_IC_IN_S is applied at the input terminal of initial circuit 310, it would generate an output signal that is very similar to initial circuit output signal IC_OUT_S at the output terminal of initial circuit 310 using the timing arc based models.

Thus, more generally, for GENERATE INITIAL CIRCUIT OUTPUT SIGNAL 410 and GENERATE EQUIVALENT INITIAL CIRCUIT INPUT SIGNAL 420, an equivalent source signal is computed that generates a similar output signal at the output node of the initial circuit as an original source signal. Typically original source signal is a distorted waveform, while the equivalent source signal is not a distorted waveform and can be used with timing arc based models. Various conventional methods can be used to generate equivalent source signals. For example one embodiment of the present invention uses the techniques of US Patent Application 20060200784, entitled "Determining Equivalent Waveforms for Distorted Waveforms", by Ding, et al.

Another embodiment of the present invention generates equivalent initial circuit input signal E_IC_IN_S by matching the arrival time and transition time (i.e. the slope or slew) of initial circuit output signal IC_OUT_S. Specifically, numerical optimization techniques, such as bisection, can be used to find a source signal that would have a product signal that matches the transition time of initial circuit output signal IC_OUT_S. Then the source signal is time shifted so that the arrival time of the product signal matches that of the initial circuit output signal IC_OUT_S. Other embodiments may use similar techniques using other characteristics of initial circuit output signal IC_OUT_S.

Figure 5C:
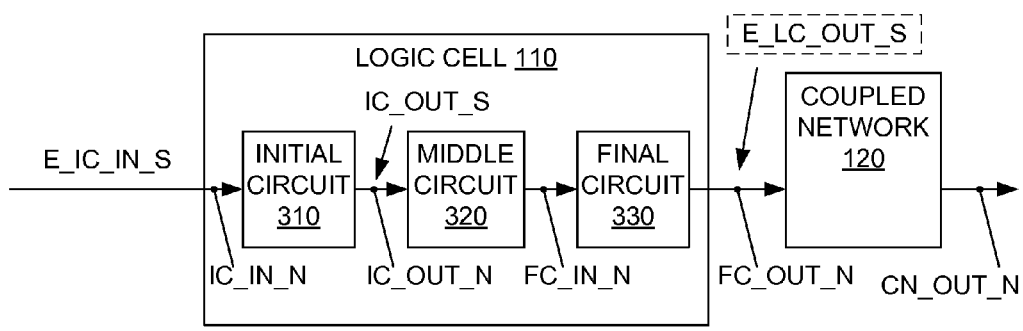

In GENERATE EQUIVALENT LOGIC CELL OUTPUT SIGNAL 430, timing arc based models are used to generate equivalent logic cell output signal E_LC_OUT_S (see FIG. 5(c)) at final circuit output node FC_OUT_N using equivalent initial circuit input signal E_IC_IN_S at initial circuit input node IC_IN_N. As explained above the timing arc based models are unable to handle the effects of coupled network 120. Thus, in GENERATE EQUIVALENT LOGIC CELL OUTPUT SIGNAL 430 the effects of coupled network 120 are approximated using lumped load capacitance. In one embodiment of the present invention, the lumped load capacitance is effective capacitance, which can be computed, for example, using techniques described in "Modeling the effective capacitance for the RC interconnect of CMOS gates," by Qian et al. in IEEE Transactions on Computer-Aided Design, vol. 13, pp. 1526-1535, 1994.

Figure 5D:
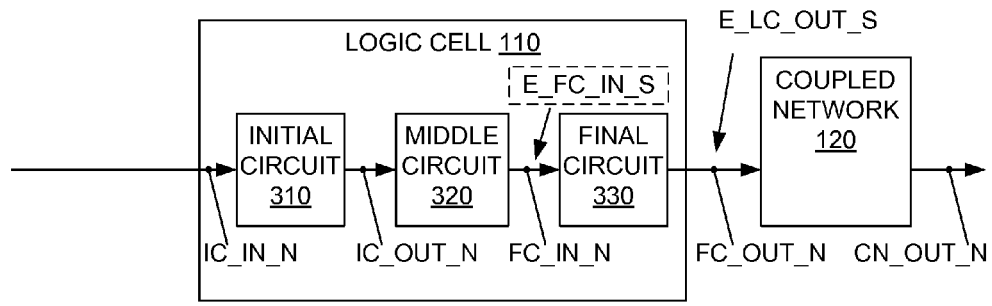

Equivalent logic cell output signal E_LC_OUT_S, is then used as the source signal (FIG. 5(d)) to derive equivalent final circuit input signal E_FC_IN_S (i.e. the product signal) in GENERATE EQUIVALENT FINAL CIRCUIT INPUT SIGNAL 440. Specifically, equivalent final circuit input signal E_FC_IN_S is generated so that an output signal generated using equivalent final circuit input signal E_FC_IN_S through final circuit 330 would be very similar to equivalent logic cell output signal E_LC_OUT_S. The techniques described above for GENERATE EQUIVALENT INITIAL CIRCUIT INPUT SIGNAL 420 can be used in GENERATE EQUIVALENT FINAL CIRCUIT INPUT SIGNAL 440.

Figure 5E:
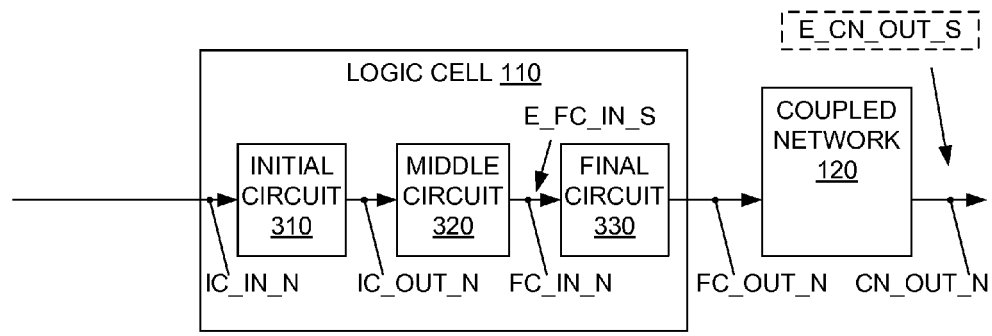

Then in GENERATE EQUIVALENT COUPLED NETWORKED OUTPUT SIGNAL 450, CCB based current models for final circuit 330 are used to generate equivalent coupled network output signal E_CN_OUT_S at final network output node CN_OUT_N (See FIG. 5(e)) using equivalent final circuit input signal E_FC_IN_S as the source signal at final circuit input node FC_IN_N. Equivalent coupled network output signal E_CN_OUT_S has the same waveform as final output signal F_OUT_S (in FIGS. 3 and 6). However, the location in the time horizon of Equivalent coupled network output signal E_CN_OUT_S relative to final output signal F_OUT_S is still undetermined at this point.

Figure 5F:
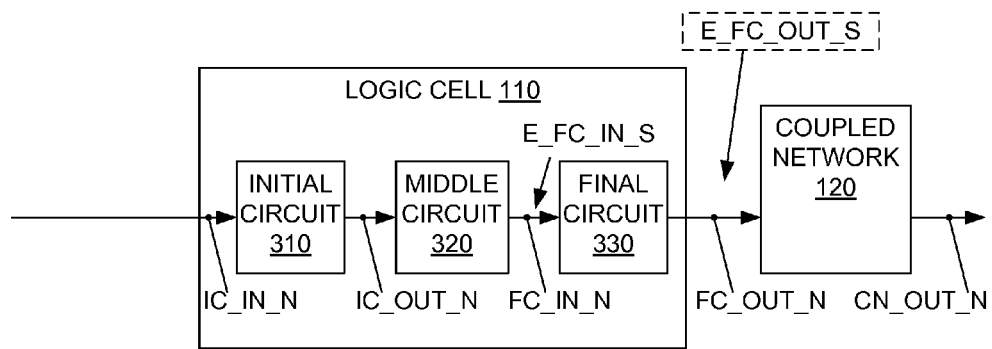

In GENERATE EQUIVALENT FINAL CIRCUIT OUTPUT SIGNAL 460 equivalent final circuit output signal is generated (see FIG. 5(f)) using CCB based current models of the final circuit having equivalent final circuit input signal E_FC_IN_S as input and having the same lumped load capacitance used in GENERATE EQUIVALENT LOGIC CELL OUTPUT SIGNAL 430 as load. In many embodiments of the present invention, only the propagation delay of final circuit 330 is calculated in GENERATE EQUIVALENT FINAL CIRCUIT OUTPUT SIGNAL 460. Furthermore, GENERATE EQUIVALENT FINAL CIRCUIT OUTPUT SIGNAL 460. may be omitted if only waveform characteristics are desired for final output signal F_OUT_S.

Figure 6:
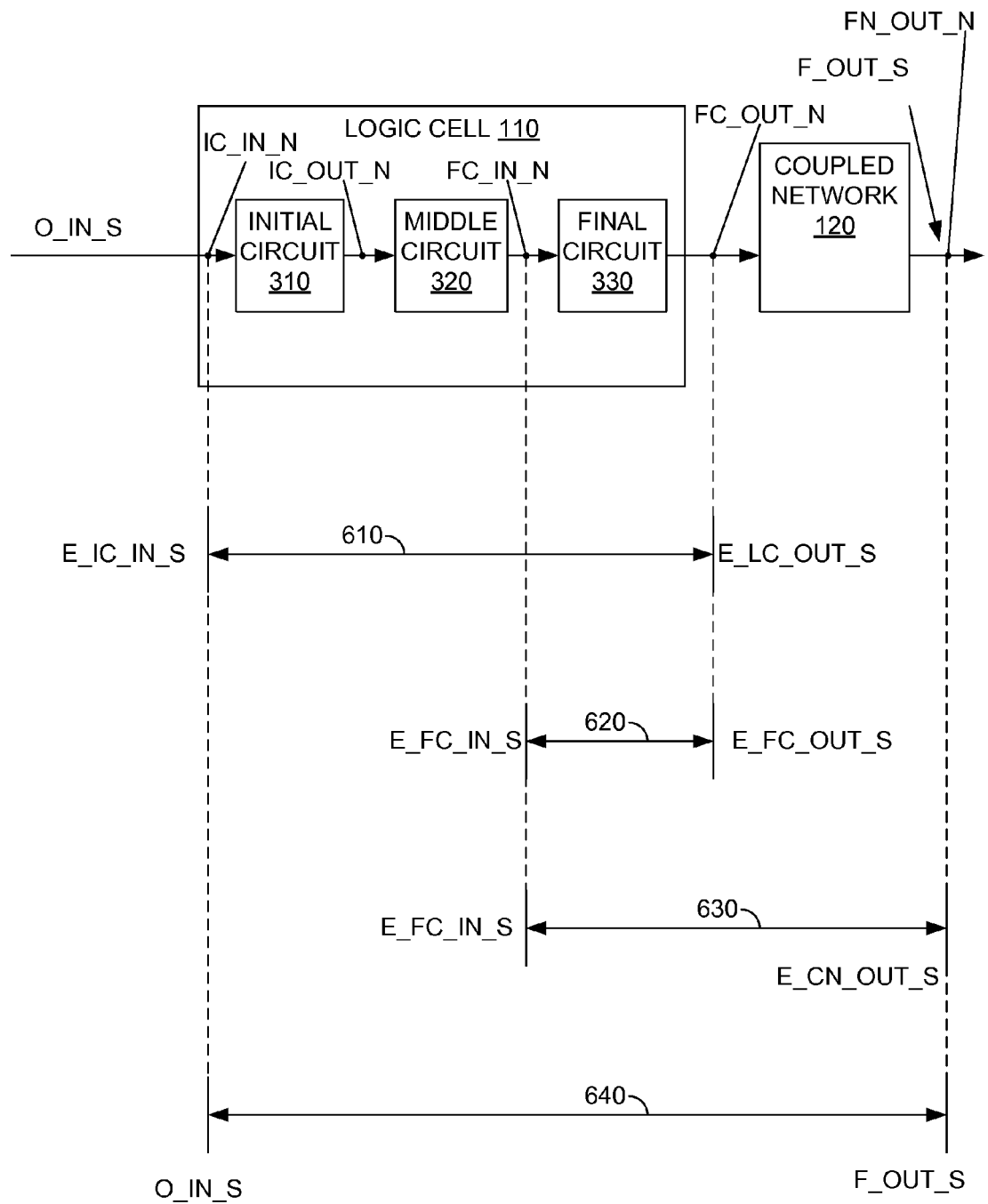
FIG. 6 illustrates the computation of timing characteristics in accordance with one embodiment of the present invention.

Finally in COMPUTE FINAL OUTPUT SIGNAL TIMING CHARACTERISTICS 470, various timing characteristics of final output signal F_OUT_S are computed using the timing characteristics of the various intermediary source signal/product signal pairs described above. As illustrated in FIG. 6, timing characteristics were determined for three source signal/product signal pairs as illustrated by timing segments 610, 620, and 630. Timing segment 610 represents the timing characteristics for the generation of equivalent logic cell output signal E_LC_OUT_S from equivalent initial circuit input signal E_IC_IN_S using timing arc based models in GENERATE EQUIVALENT LOGIC CELL OUTPUT SIGNAL 430. Timing segment 620 represents the timing characteristics for the generation of equivalent final circuit output signal E_FC_OUT_S from equivalent final circuit input signal E_FC_IN_S using CCB based current models in GENERATE EQUIVALENT FINAL CIRCUIT OUTPUT SIGNAL 460. Timing segment 630 represents the timing characteristics for the generation of equivalent coupled network output signal E_CN_OUT_S from equivalent final circuit input signal E_FC_IN_S using current based model in GENERATE EQUIVALENT COUPLED NETWORK OUTPUT SIGNAL 450.

Also shown in FIG. 6 is timing segment 640 which represents the timing characteristics for the generation of final output signal F_OUT_S from original input signal O_IN_S. As explained above, neither timing arc based models or CCB based current models alone can be used to derive the timing characteristics of timing segment 640. However, using the principals of the present invention the timing characteristics of timing segments 610, 620, and 630 can be used to compute various timing characteristics of timing segment 640. Specifically, as illustrated in FIG. 6, timing segment 610 and timing segment 630 overlap. The portion of overlap is equivalent to timing segment 620. Thus, timing characteristics for timing segment 640 can be obtained by combining the timing characteristics in timing segments 610 and 630 and removing the timing characteristics of timing segment 620.

For example, the propagation delay of final output signal F_OUT_S from original input signal O_IN_S is equal to the propagation delay of timing segment 610 plus the propagation delay of timing segment 630 and minus the propagation delay of timing segment 620. Because equivalent coupled network output signal E_CN_OUT_S is the same as final output signal F_OUT_S, many timing characteristics are derived directly from equivalent coupled network output signal E_CN_OUT_S.

Generally, the present invention is likely to be implemented on a computer as part of an EDA package. The computer programmed in accordance with the invention receives a design of an integrated circuit device. Then, with appropriate parameters from the user, the timing characteristics of various logic cells are analyzed.

The data structures and software code for implementing one or more acts described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet. In one embodiment, the carrier wave includes computer instruction signals for carrying out the process described above.

Numerous modifications and adaptations of the embodiments described herein will become apparent to the skilled artisan in view of this disclosure and are encompassed by the scope of the invention.

What is claimed is:

1. A method of performing timing analysis on a computer for a logic cell receiving an original input signal and generating a final output signal through a coupled network; the method comprising:

generating an intermediary signal on the computer using a first timing arc based model; and generating an equivalent coupled network output signal on the computer using a first channel connected block based current model.

2. The method of claim 1, further comprising generating an equivalent initial circuit input signal on the computer for an initial circuit of the logic cell.

3. The method of claim 2, wherein the generating an equivalent initial circuit input signal on the computer for an initial circuit of the logic cell further comprises:

generating an initial circuit output signal for the initial circuit using the original input signal and a second channel connected block based current model for the initial circuit; and generating the equivalent initial circuit input signal that would produce the initial circuit output signal as an output signal of the initial circuit.

4. The method of claim 2, wherein the generating an intermediary signal on the computer using a first timing arc based model, further comprises calculating the intermediary signal as an equivalent logic cell output signal using the equivalent initial circuit input signal and the first timing arc based model, wherein the first timing arc based model models the logic cell.

5. The method of claim 4, wherein a lumped capacitance approximation is used for the coupled network during the generating an intermediary signal using a first timing arc based model.

6. The method of claim 4, further comprising generating an equivalent final circuit input signal on the computer for a final circuit of the logic cell.

7. The method of claim 6, wherein the equivalent final circuit input signal for the final circuit would produce the intermediary signal as an output signal of the final circuit.

8. The method of claim 6, wherein the generating an equivalent coupled network output signal on the computer using a first channel connected block based current model is performed using the equivalent final circuit input signal and wherein the first channel connected block based current model models the final circuit.

9. The method of claim 8, further comprising calculating a final circuit propagation delay of the final circuit on the computer.

10. The method of claim 9, wherein the calculating the final circuit propagation delay of the final circuit on a computer is performed using the equivalent final circuit input signal and using a lumped capacitance approximation for the coupled network.

11. The method of claim 9 further comprising computing a final output propagation delay on the computer.

12. The method of claim 11, wherein the final output propagation delay is equal to a propagation delay of the intermediary signal plus a propagation delay of the equivalent coupled network output signal minus the final circuit propagation delay.

13. A non-transitory computer-readable storage medium encoded with instructions to perform the method of claim 1.

14. A system for performing timing analysis for a logic cell receiving an original input signal and generating a final output signal through a coupled network; the method system comprising:

means for generating an intermediary signal using a first timing arc based model; and means for generating an equivalent coupled network output signal using a first channel connected block based current model.

15. The system of claim 14, further comprising means for generating an equivalent initial circuit input signal for an initial circuit of the logic cell.

16. The system of claim 15, wherein the means for generating an equivalent initial circuit input signal for an initial circuit of the logic cell further comprises:

means for generating an initial circuit output signal for the initial circuit using the original input signal and a second channel connected block based current model for the initial circuit; and means for generating the equivalent initial circuit input signal that would produce the initial circuit output signal as an output signal of the initial circuit.

17. The system of claim 15, wherein the means for generating an intermediary signal using a first timing arc based model, further comprises means for calculating the intermediary signal as an equivalent logic cell output signal using the equivalent initial circuit input signal and the first timing arc based model, wherein the first timing arc based model models the logic cell.

18. The system of claim 17, further comprising means for generating an equivalent final circuit input signal for a final circuit of the logic cell.

19. The system of claim 18, wherein the equivalent final circuit input signal for the final circuit would produce the intermediary signal as an output signal of the final circuit.

20. The system of claim 18, wherein the means for generating an equivalent coupled network output signal using a first channel connected block based current model uses the equivalent final circuit input signal and wherein the first channel connected block based current model models the final circuit.

21. The system of claim 20, further comprising means for calculating a final circuit propagation delay of the final circuit.

22. The system of claim 21, wherein the means for calculating the final circuit propagation delay of the final circuit uses the equivalent final circuit input signal and a lumped capacitance approximation for the coupled network and using a lumped capacitance approximation for the coupled network.

23. The system of claim 21, further comprising computing a final output propagation delay, wherein the final output propagation delay is equal to a propagation delay of the intermediary signal plus a propagation delay of the equivalent coupled network output signal minus the final circuit propagation delay.

24. A computer system configured to perform a method of performing timing analysis for a logic cell receiving an original input signal and generating a final output signal through a coupled network; the method comprising:

generating an intermediary signal using a first timing arc based model; and generating an equivalent coupled network output signal using a first channel connected block based current model.

* * * * *